United States Patent [19]

Suzuki et al.

[11] Patent Number: 5,640,046
[45] Date of Patent: Jun. 17, 1997

[54] COOLING STRUCTURE FOR INTEGRATED CIRCUIT ELEMENT MODULES, ELECTRONIC DEVICE AND HEAT SINK BLOCK

[75] Inventors: Masahiro Suzuki; Akihiko Fujisaki; Junichi Ishimine, all of Kawasaki, Japan

[73] Assignee: Fujitsu Limited, Kawasaki, Japan

[21] Appl. No.: 431,978

[22] Filed: May 1, 1995

[30] Foreign Application Priority Data

May 27, 1994 [JP] Japan .................................. 6-115409

[51] Int. Cl.⁶ .................................................. H01L 23/34
[52] U.S. Cl. .......................... 257/714; 257/721; 361/697
[58] Field of Search .............................. 257/721, 714; 361/691, 690, 697

[56] References Cited

U.S. PATENT DOCUMENTS 4,296,455  10/1981  Leaycraft et al. .................. 257/721
4,851,965  7/1989  Gabuzda et al. .................. 361/691

FOREIGN PATENT DOCUMENTS 59-202657  11/1984  Japan .
1-28896  1/1989  Japan .................. 361/691

Primary Examiner—Sara W. Crane
Assistant Examiner—Roy Potter
Attorney, Agent, or Firm—Armstrong, Westerman, Hattori, McLeland & Naughton

[57] ABSTRACT

In a cooling structure for cooling circuit element modules that are mounted on a circuit board and has heat sinks, there are provided a main duct to which the circuit element modules are connected, and a coolant supplying device which is connected to the main duct and supplies a coolant to the main duct.

33 Claims, 17 Drawing Sheets

COOLING STRUCTURE FOR INTEGRATED CIRCUIT ELEMENT MODULES, ELECTRONIC DEVICE AND HEAT SINK BLOCK

BACKGROUND OF THE INVENTION

1. Field of the Invention

The present invention generally relates to cooling structures for integrated circuit element modules, and more particularly to a cooling structure for removing heat generated in integrated circuit element modules.

Recently, the density of mounting integrated circuit elements has been increased, and the amount of heat generated in integrated circuit elements themselves has increased. It has become more difficult to cope with heat by a conventional forced cooling system. Nowadays, it is required to provide an improved cooling system having a higher capability of cooling integrated circuit elements.

2. Description of the Prior Art

FIG. 1 is a partially sectional, perspective view of a device having a conventional cooling structure for integrated circuit elements, as disclosed in Japanese Laid-Open Patent Application No. 59-202657. Further, FIG. 2 is a cross-sectional view taken along a line A—A shown in FIG. 1. As shown in FIGS. 1 and 2, a plurality of integrated circuit elements 3 are mounted on a circuit board 1. Heat sinks 4 are respectively attached to the integrated circuit elements 3. Each of the heat sinks 4 may have a number of fins. In the example being considered, the integrated circuit elements 3 with the heat sinks 4 are referred to as integrated circuit element modules 2. A duct 5 is provided above the circuit board 1. A plurality of holes 6 are formed in a bottom part 5a of the duct 5 so that the holes 6 face the heat sinks 4. Blowers or fans 7 are provided to supply air to the duct 5.

The cooling structure shown in FIG. 1 operates as follows. Heat generated in the integrated circuit elements 3 is conducted to the heat sinks 4. Air is supplied to the duct 5 by the blowers 7, and arrives at the heat sink 4, which are cooled by the air. Hence, the integrated circuit elements 3 connected to the heat sink 4 are cooled.

The thermal resistance Θfa (°C./W) between a fin of a heat sink and a coolant (air in the example being considered) is a parameter representing the cooling performance of the fin. The thermal resistance can be written as follows:

$$\Theta fa = 1/(Af \cdot h)$$

where Af denotes the effective area (m²) of the fin, and h denotes the average thermal conductivity (W/m²K).

In the cooling structure for the integrated circuit element modules shown in FIGS. 1 and 2, there are spaces (opens) between the bottom surface 5a of the duct 5 and the heat sinks 4. If the fins are miniaturized to increase the effective area Af to thereby improve the cooling performance, a large loss of pressure is caused by the fins. The above large loss leads to preventing air from passing through the fins and thus reducing the average thermal conductivity h. As a result, the cooling performance (the thermal resistance Θfa) is restricted to a certain level.

Air supplied to the integrated circuit element modules 2 located on the downstream side of flow, in other words, away from the blowers 7 has an increased temperature due to heat generated in the modules 2 located on the upstream side thereof. Hence, these modules 2 cannot be cooled effectively and efficiently.

SUMMARY OF THE INVENTION

It is a general object of the present invention to provide a cooling structure for integrated circuit element modules in which the above disadvantages are eliminated.

A more specific object of the present invention is to provide a cooling structure which has improved cooling performance and is capable of approximately evenly cooling all integrated circuit element modules in a system which is the subject to be cooled.

The above objects of the present invention are achieved by a cooling structure for cooling circuit element modules that are mounted on a circuit board and has heat sinks, the cooling structure comprising: a main duct to which the circuit element modules are connected; and a coolant supplying device which is connected to the main duct and supplies a coolant to the main duct. Hence, it is possible to forcedly cool the circuit element modules via the main duct effectively and efficiently.

Another object of the present invention is to provide an electronic device suitable for the above cooling structure.

This object of the present invention is achieved by an electronic device comprising: a circuit board; and circuit element modules mounted on the circuit board, each of the circuit element modules comprises: a circuit element mounted on the circuit board; and a heat sink attached to the circuit element and coupled to a main duct in which a coolant is transferred. The heat sink includes one or a plurality of heat sink blocks. Each of the heat sink blocks includes: a base attached to the circuit element; fins mounted on the base; and a partition duct covering the fins and having a first opening coupled to the main duct and a second opening facing the fins, the first and second openings being coupled together, an inner coolant passage passing through the fins being coupled to the second opening and an outer coolant passage defined by the partition duct.

Yet another object of the present invention is to provide a heat sink suitable for the above cooling structure.

This object of the present invention is achieved by a heat sink block comprising: a base to be attached to the circuit element; fins mounted on the base; and a partition duct covering the fins and having a first opening to be coupled to a main duct and a second opening facing the fins, the first and second openings being coupled together, an inner coolant passage passing through the fins being coupled to the second opening and an outer coolant passage defined by the partition duct.

DESCRIPTION OF THE PREFERRED EMBODIMENTS

Figure 1:
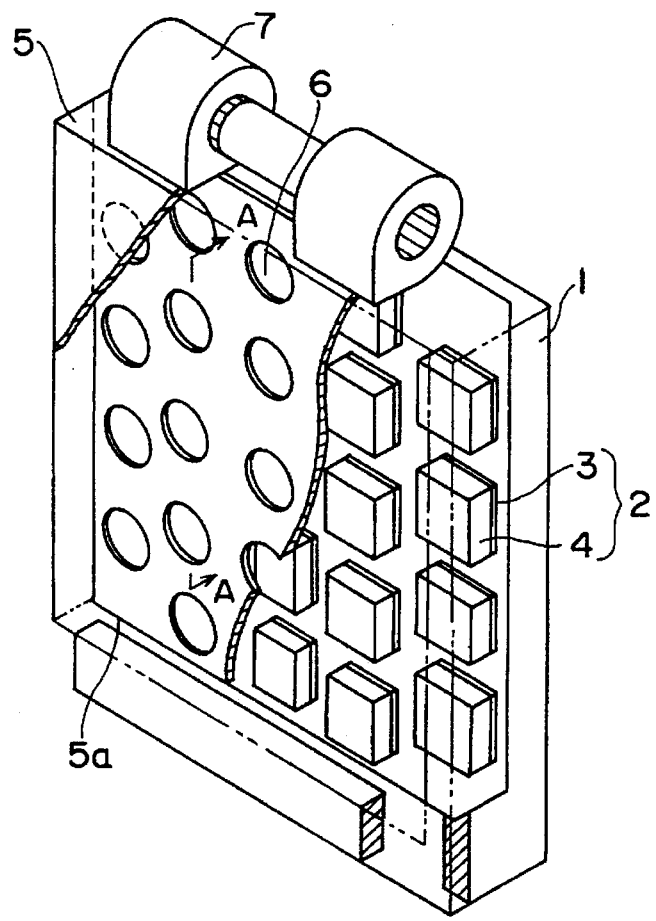
FIG. 1 a partially sectional, perspective view of a device having a conventional cooling structure for integrated circuit elements.
Figure 2:
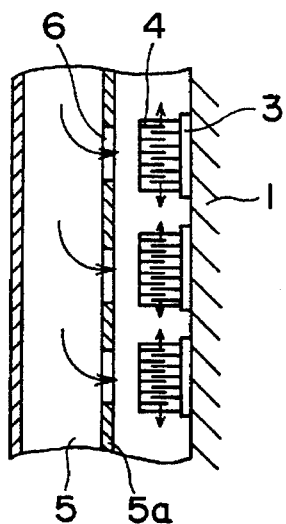
FIG. 2 is a cross-sectional view taken along a line A—A shown in FIG. 1.
Figure 3:
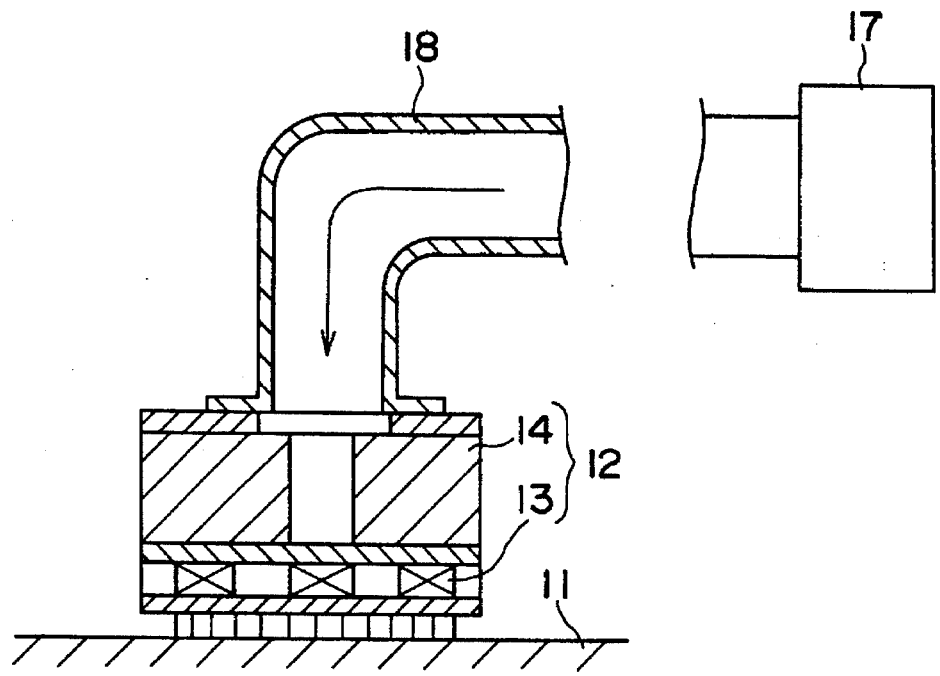
FIG. 3 is a diagram showing a principle of the present invention.

FIG. 3 is a diagram of a principle of the present invention. An integrated circuit element 13 is mounted on a circuit board 11. A heat sink 14 is attached to the integrated circuit element 13 so that an integrated circuit element module 12 is formed. A main duct 18 is joined to the heat sink 14 of the module 12. In the structure shown in FIG. 3, the main duct 18 continues to a center hole of the heat sink 14. A coolant supply device 17 is coupled to the main duct 18, and supplies air thereto. A coolant such as air is supplied from the device 17 and is transferred via the main duct 18. Then the coolant is definitely supplied to the heat sink 14. Thus, the integrated circuit element 13 can be cooled effectively and efficiently, as compared to the prior art shown in FIGS. 1 and 2.

Figure 4:
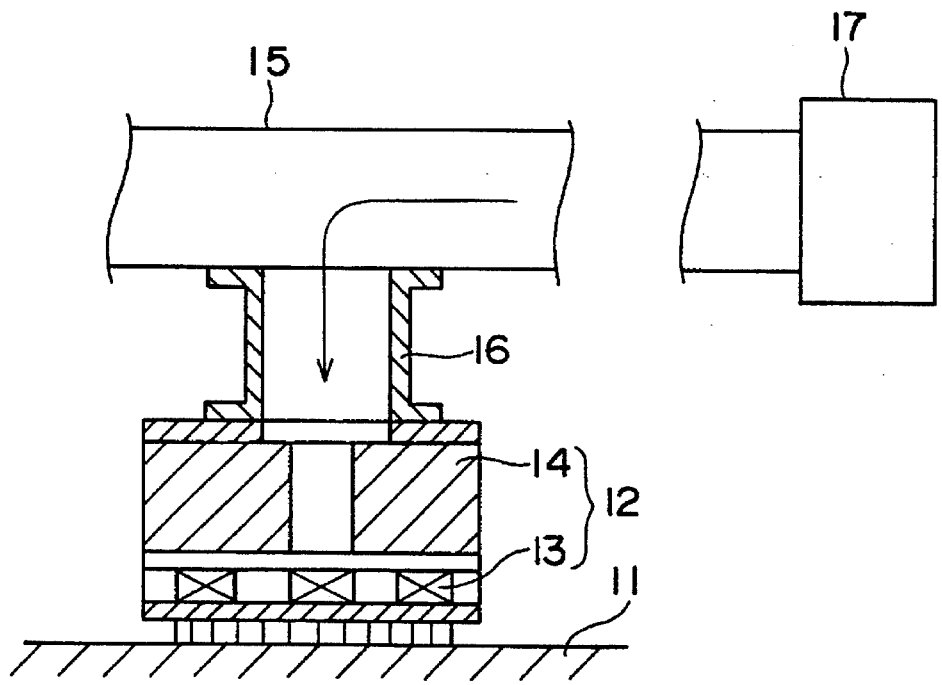
FIG. 4 is a diagram showing another principle of the present invention.

FIG. 4 is a diagram of another principle of the present invention. In FIG. 4, parts that are the same as those shown in FIG. 3 are given the same reference numbers. A main duct 15 connected to the coolant supply device 17 is provided over the integrated circuit module 12. A module joint duct 16 has one opening end connected to an opening formed in the main duct 15, and the other end connected to the heat sink 14. The coolant is supplied from the device and is transferred via the main duct 15. Then the air branches into the module joint duct 16 and is supplied to the heat sink 14. Thus, the integrated circuit element 13 can be cooled effectively and efficiently, as compared to the prior art shown in FIGS. 1 and 2.

Figure 5:
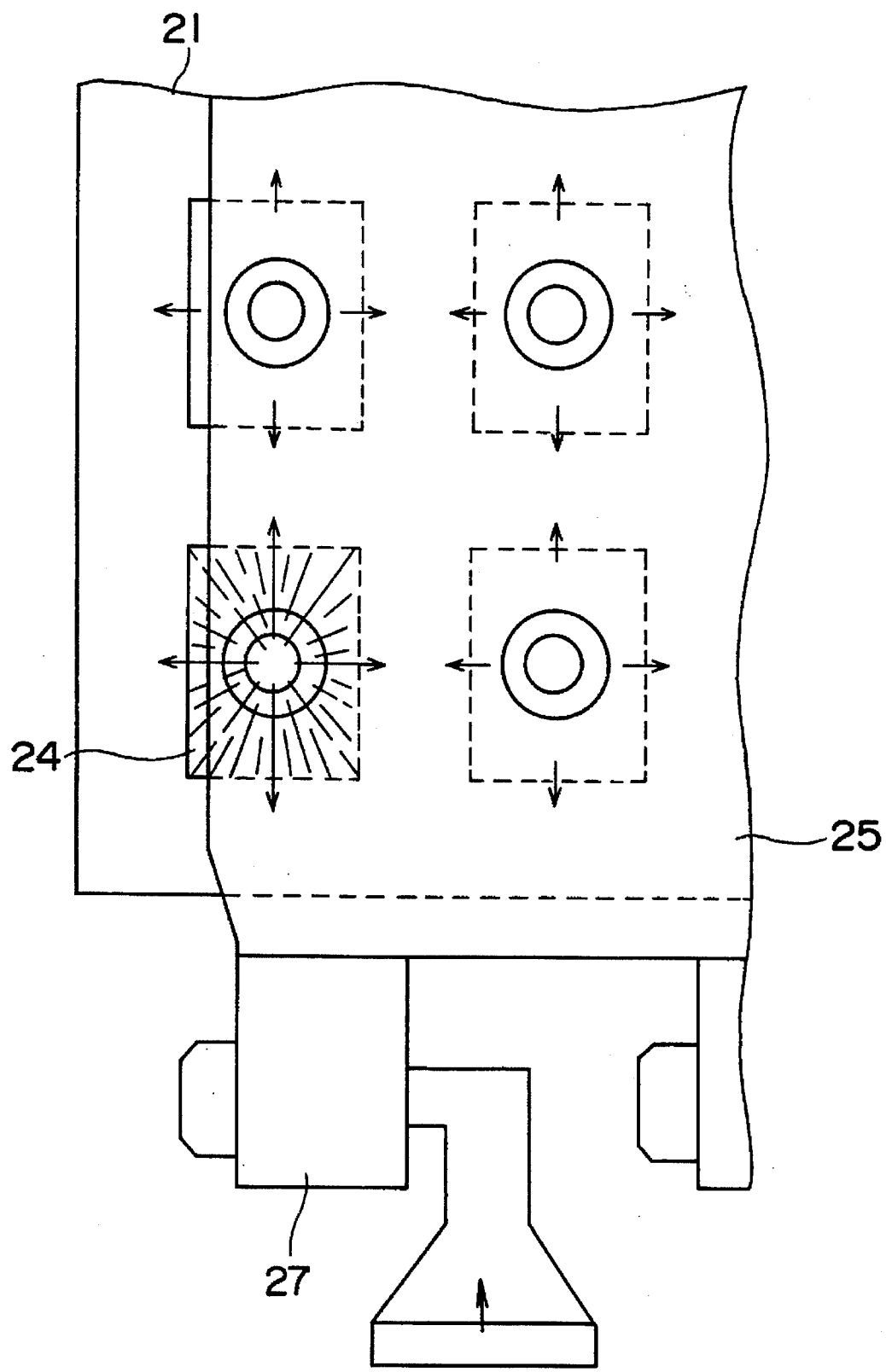
FIG. 5 is a plan view of a first embodiment of the present invention.
Figure 6:
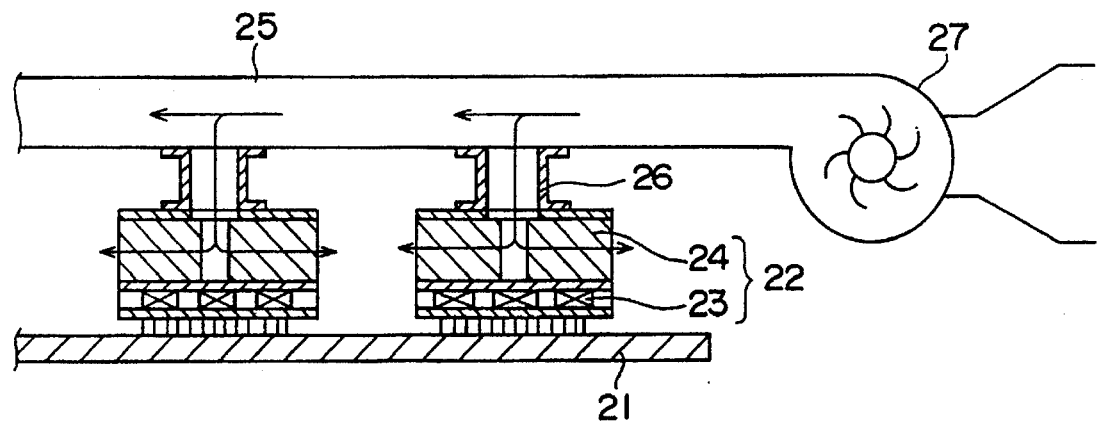
FIG. 6 is a left side view of the first embodiment of the present invention shown in FIG. 2.

A description will now be given of a first embodiment of the present invention. FIG. 5 is a plan view of an essential part of the first embodiment of the present invention, and FIG. 6 is a cross-sectional view of the left-side part of the first embodiment of the present invention. A plurality of integrated circuit element 23 are mounted on a circuit board 21 such as a printed circuit board. Heat sinks 24 are attached to the top surfaces of the integrated circuit elements 23 so that integrated circuit element modules 22 are formed.

A main duct 25 is provided over the heat sinks 24 of the modules 22. Module joint ducts 26 are respectively provided to the heat sinks 24 of the modules. Each of the module joint ducts 26 has one opening end connected to the bottom surface of the main duct 25, and the other end connected to the corresponding heat sink 24. The upper opening ends of the module joint ducts 26 continue to openings formed on the bottom surface of the main duct 25. The lower opening ends of the module joint ducts 26 continue to center holes of the heat sinks 24. At least one blower or fan 27 used to supply a coolant, such as air, to the main duct 26 is connected to an end portion of the main duct 25. As will be seen from FIG. 5, a plurality of blowers 27 can be provided to the main duct 25.

Figure 7A:
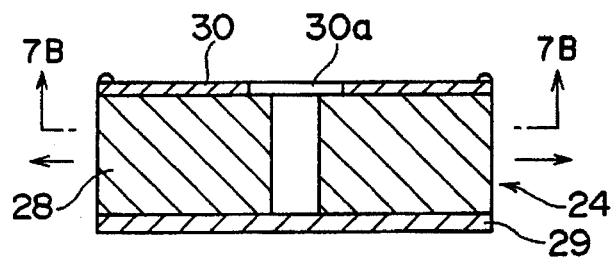
FIG. 7A is a cross-sectional view of a heat sink shown in FIG. 5.
Figure 7B:
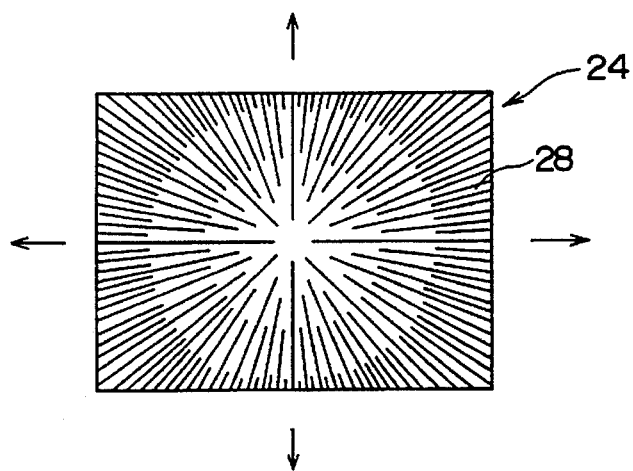
FIG. 7B is a sectional view taken along a line B—B shown in FIG. 7A.

FIGS. 7A and 7B show the structure of each of the heat sinks 24. More particularly, FIG. 7A is a cross-sectional view of the heat sink 24, and FIG. 7B is a sectional view taken along a line B—B shown in FIG. 7A. The heat sink 24 has a base 29, a cover 30, and fins 28. The base 29 is attached to the top of the integrated circuit element 23. The fins 28 are mounted on the base 29 so that the fins 28 are arranged in a radial formation and a center hole is formed by the ends of the fins 28. The cover 30, placed on the fins 28, has a through hole 30a continuing to the center hole defined by the fins 28.

The total pressure loss caused in the heat sinks 24 can be determined under either the following first condition or the second condition:

1st Condition

For a heat sink of 70 mm×30 mm, for example, $_\Delta P(mmH_2O) \geq 10\ V^2$

V: The mount of blow by blower 27 (m³/min) (e.g. when V=1 m³/min, then $_\Delta P \geq 10$ mmH$_2$O)

2nd Condition

Total pressure loss caused in the heat sinks 24 is at least 25% of the loss of pressure in the whole device.

A description will now be given of the operation of the first embodiment of the present invention. Heat generated in the integrated circuit elements 23 of the module 22 is transferred to the heat sinks 24. When the blower 27 is driven, air is transported in the main duct 25, and is supplied to the heat sinks 24 of the modules 22 via the module joint ducts 26. Then, the blown air passes through the through holes 30a formed in the covers 30 of the modules 22, and then passes through the coolant passages defined by the fins 28. Then, the air radially goes out of the fins 28. While the air is passing through the passage defined by the fins 28, thermal exchange takes place so that the heat sinks 24 are cooled.

The module joint duct 26 function to forcedly supply the air blown by the blower 27 to the heat sinks 24. Hence, the heat sinks 24 can be cooled effectively and efficiently.

Under the above first or second condition, approximately uniform air can be supplied to the integrated circuit element modules 22 because the pressure loss caused in the fins 28 is much greater than the pressure loss in the other duct parts.

Figure 8A:
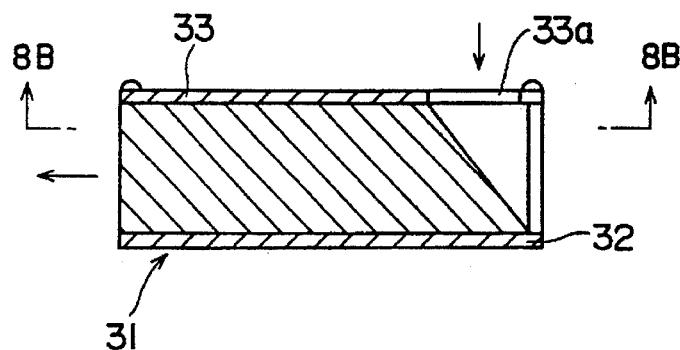
FIG. 8A is a cross-sectional view of an alternative heat sink.
Figure 8B:
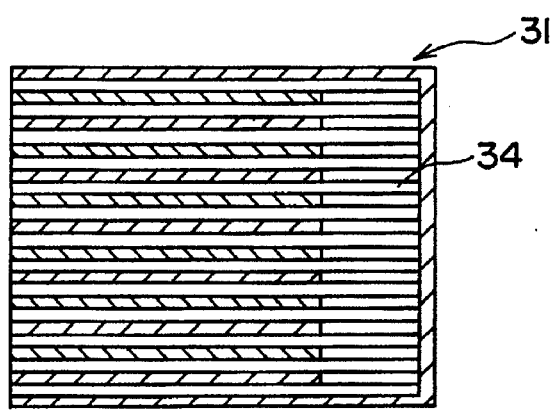
FIG. 8B is a sectional view taken along a line C—C shown in FIG. 8A.

FIGS. 8A and 8B show a heat sink 31 having a structure different from that of the heat sink 24 shown in FIGS. 7A and 7B. More particularly, FIG. 8A is a cross-sectional view of the heat sink 31, and FIG. 8B is a sectional view taken along a line C—C shown in FIG. 8A. The heat sink 31 can be used instead of each of the heat sinks 24.

The heat sink 31 includes a base 32, a cover 33 and fins 34. The base 32 has three side surfaces. The fins 34 are mounted on the base 32. The cover 33 has a through hole 33a located at an end portion of the cover 33. The cover 33 is placed on the fins 34, which are arranged in parallel. The fins 34 has tapered portions obliquely facing the through hole 33a of the cover 33. The air passes through the through hole 33a and air passages defined by the parallel-arranged fins 34. The heat sink 31 has almost the same effects as those of the heat sink 24.

Figure 9:
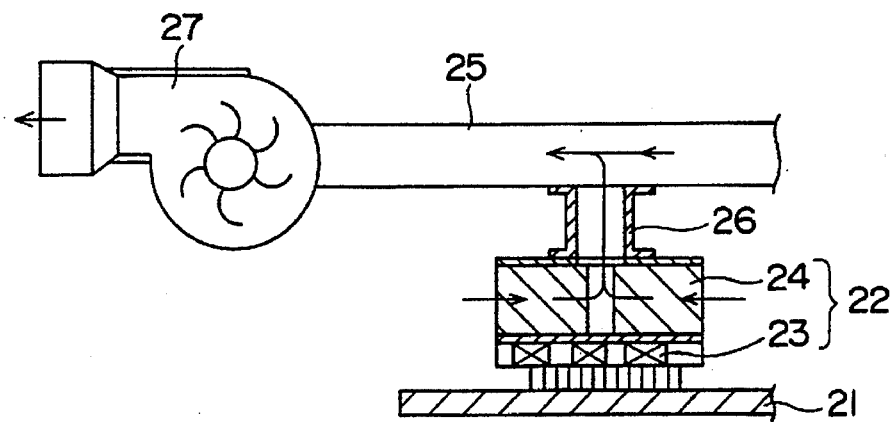
FIG. 9 is a view for explaining an alternative fan replaceable with the fan shown in FIG. 5.

The fan or blower 27 shown in FIG. 6 functions to supply air to the main duct 25. Alternatively, it is possible to suck air from the main duct 25, as shown in FIG. 9. The blower 27 used in the structure shown in FIG. 9 functions as a suction blower. In this case, air enters into the heat sinks 24 from the periphery thereof, and is sucked by the suction blower 27 via the module joint ducts 26 and the main duct 25.

Figure 10:
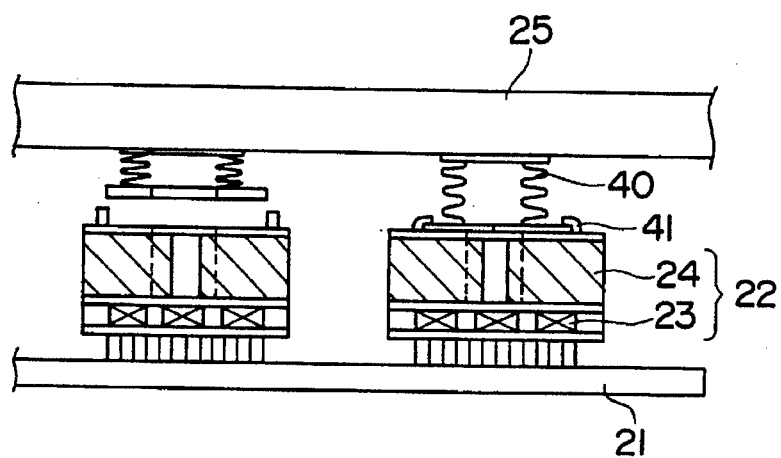
FIG. 10 is a diagram of a second embodiment of the present invention.

A description will now be given, with reference to FIG. 10, of a second embodiment of the present invention. The second embodiment of the present invention differs from the first embodiment thereof in the structure of the module joint ducts. In FIG. 10, parts that are the same as those shown in the previously described figures are given the same reference numbers. The second embodiment of the present invention employs module joint ducts 40 having a flexible structure, such as bellows. Each of the bellows-shaped duct 40 has one opening end permanently connected to an opening formed in the bottom surface of the main duct 25, and the other opening end to which a lock mechanism 41 is attached. The lock mechanism 41 is provided on the top of the heat sink 24, and detachably engages the end of the bellows-shaped duct 40. In FIG. 10, the left-hand duct 40 is in the contracted (detached) state, and the right-hand duct 40 is in the engaged (expanded) state.

The bellows-shaped ducts 40 has the same advantages as those obtained in the first embodiment of the present invention, and further function to facilitate maintenance and replacement work for the main duct 25 and the integrated circuit element modules 22.

It is possible to attach the lock mechanism 41 to the main duct 25, and the bellows-shaped ducts are fixed to the top of the heat sinks 24. Alternatively, each of the bellows-shaped ducts has two detachable ends. That is, these bellows-shaped ducts are detachable attached to the heat sinks 24 and the main duct 25.

Figure 11:
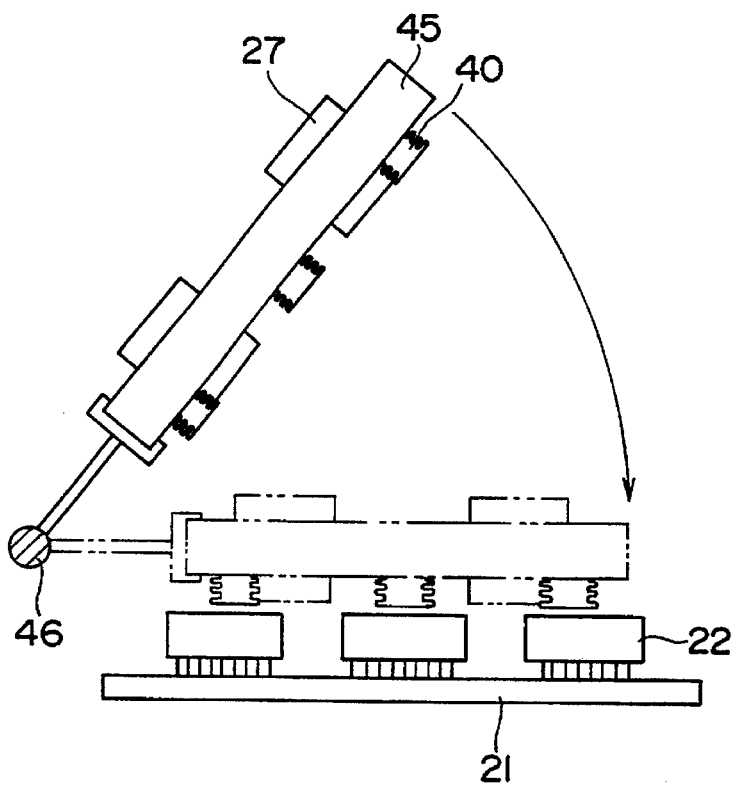
FIG. 11 is a diagram of a third embodiment of the present invention.

A description will now be given, with reference to FIG. 11, of a third embodiment of the present invention. The third embodiment of the present invention differs from the second embodiment thereof in the structure of the main duct. The third embodiment of the present invention employs a main duct 45, which is rotatably supported by a shaft 46. The shaft 46 is supported by, for example, a frame of a device (not shown for the sake of simplicity) housing the circuit board 21. The fan 27 is attached to the main duct 45, as shown in FIG. 11. Further, the bellows-shaped module joint ducts 40 are attached to the main duct 45, as shown in FIG. 11.

When the main duct 45 is horizontally maintained, the ducts 40 can be connected to the heat sinks of the integrated circuit element modules 22. Normally, the main duct 45 is maintained in this state. When maintenance or replacement operation is performed, the ducts 45 are detached from the modules 22, and then the main duct 45 is rotated upwards. Hence, the maintenance or replacement operation on the modules 22 can be facilitated.

Figure 12:
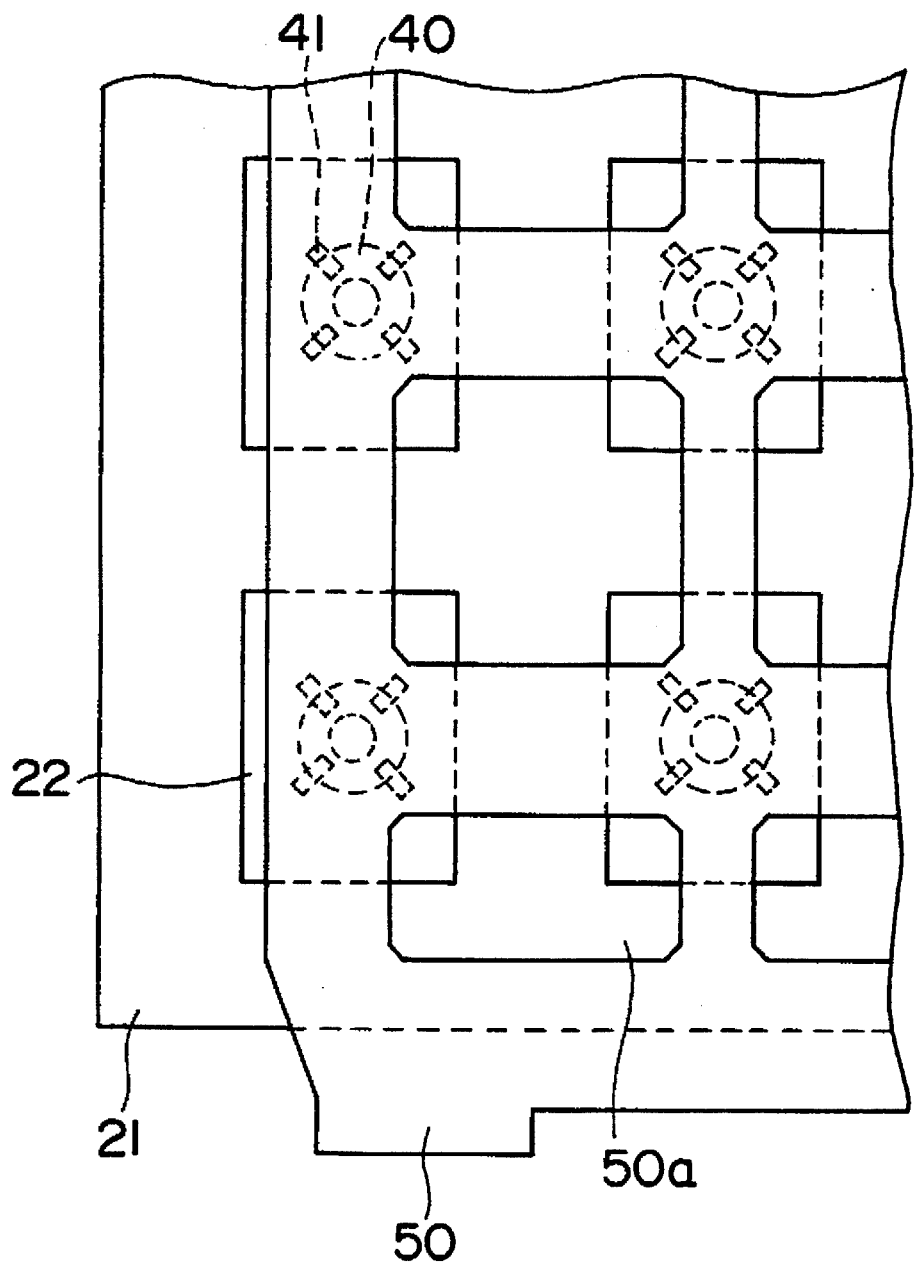
FIG. 12 is a plan view of a fourth embodiment of the present invention.

A description will now be given, with reference to FIG. 12, of a fourth embodiment of the present invention. The fourth embodiment of the present invention differs from the third embodiment thereof in the structure of the main duct. In FIG. 12, parts that are the same as those shown in the previously described figures are given the same reference numbers.

The structure shown in FIG. 12 employs a main duct 50 in which through openings 50a are formed. The maintenance person can access to the module joint ducts 40 via the through openings 50a, and can easily operate the lock mechanism 41 to lock or unlock the ducts 40. Of course, the structure shown in FIG. 12 can cool the modules 22 effectively and efficiently, as in the case of the first through third embodiments of the present invention.

Figure 13:
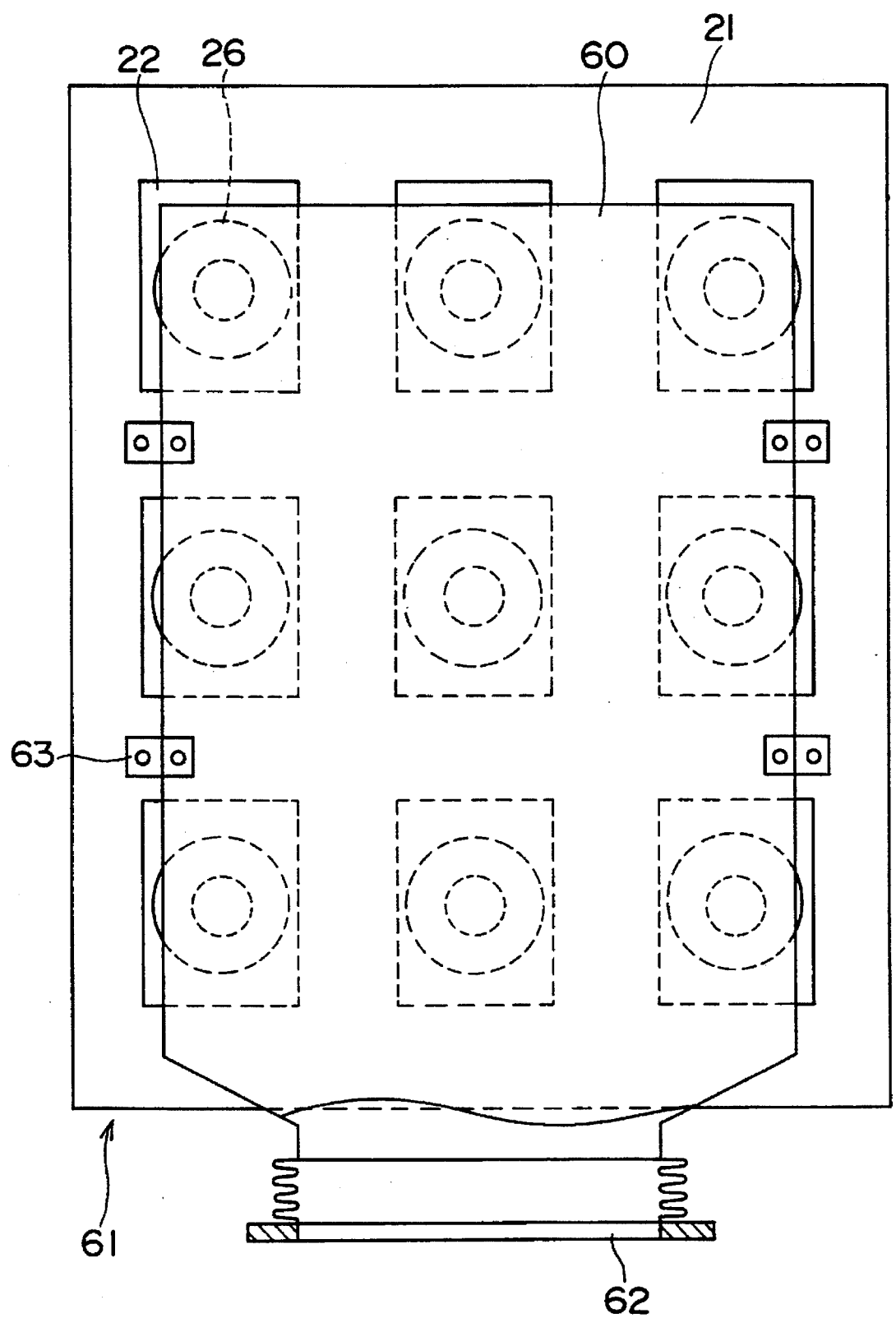
FIG. 13 is a plan view of a fifth embodiment of the present invention.
Figure 14:
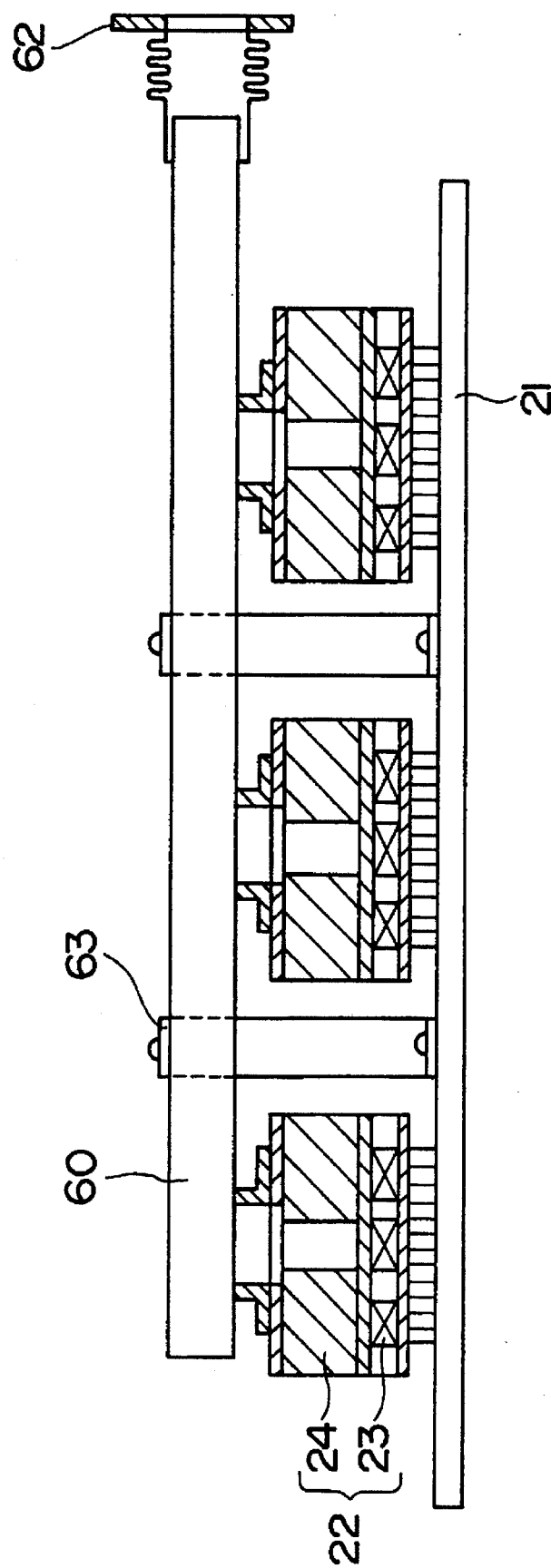
FIG. 14 is a left side view of the fifth embodiment of the present invention shown in FIG. 13.

A description will now be given, with reference to FIGS. 13 and 14, of a fifth embodiment of the present invention. More particularly, FIG. 13 is a plan view of the fifth embodiment of the present invention, and FIG. 14 is a left side view thereof. The structure shown in FIGS. 13 and 14 differs from that of the first embodiment of the present invention in the structure of the main duct. In FIGS. 13 and 14, parts that are the same as those shown in the previously described figures are given the same reference numbers.

The structure shown in FIG. 14 has a main duct 60, which is attached to the circuit board 21 by means of attachment brackets 63. The circuit board 21, the integrated circuit element modules 22 and the main duct 60 are integrated, so that a board module 61 is formed. A blower or fan (not shown in FIG. 14) is coupled to one end of the main duct by means of a connection duct 62 having a bellows shape. A lock mechanism of the connection duct 62 can be attached to the blower. The connection duct 62 is attached to the center portion of the main duct 60 in a different way from that shown in FIG. 5 or FIG. 12. According to the fifth embodiment of the present invention, the blower can be easily attached to or detached from the main duct 60. Of course, the cooling structure shown in FIG. 14 is capable of cooling the modules 22 effectively and efficiently.

Figure 15:
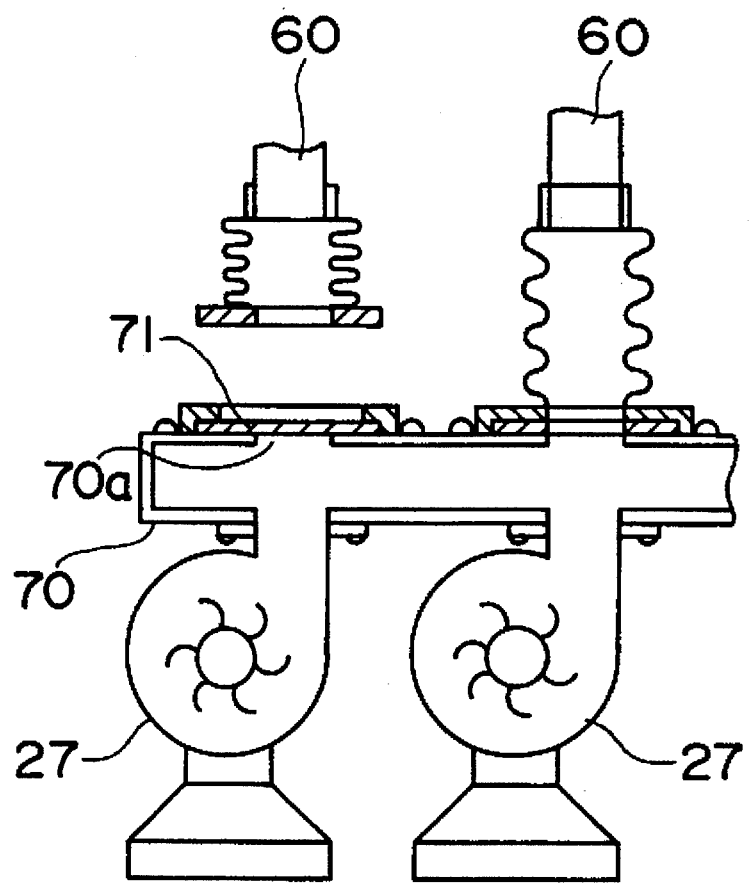
FIG. 15 is a diagram of a sixth embodiment of the present invention.

A description will now be given, with reference to FIG. 15, of a sixth embodiment of the present invention. The sixth embodiment of the present invention differs from the fifth embodiment thereof in that a header duct 70 is provided, as shown in FIG. 15, in which parts that are the same as those shown in the previously described figures are given the same reference numbers. A plurality of main ducts 60 are attached to the corresponding fans 27 via the header duct 70, which has openings 70a formed on the both opposing surfaces thereof. The opening which is not used to attach the main duct 60 is sealed by a sealing plate 71, as shown in FIG. 15. It is possible to select an appropriate number of board modules 61 and/or an appropriate number of fans 27, taking into consideration of, for example, the amount of heat generated by the modules 22 to be cooled, the driving ability of the fans and so on. In other words, the header duct 70 enables a desired number of circuit boards 61 and a desired number of fans 27 to be joined together.

Figure 16:
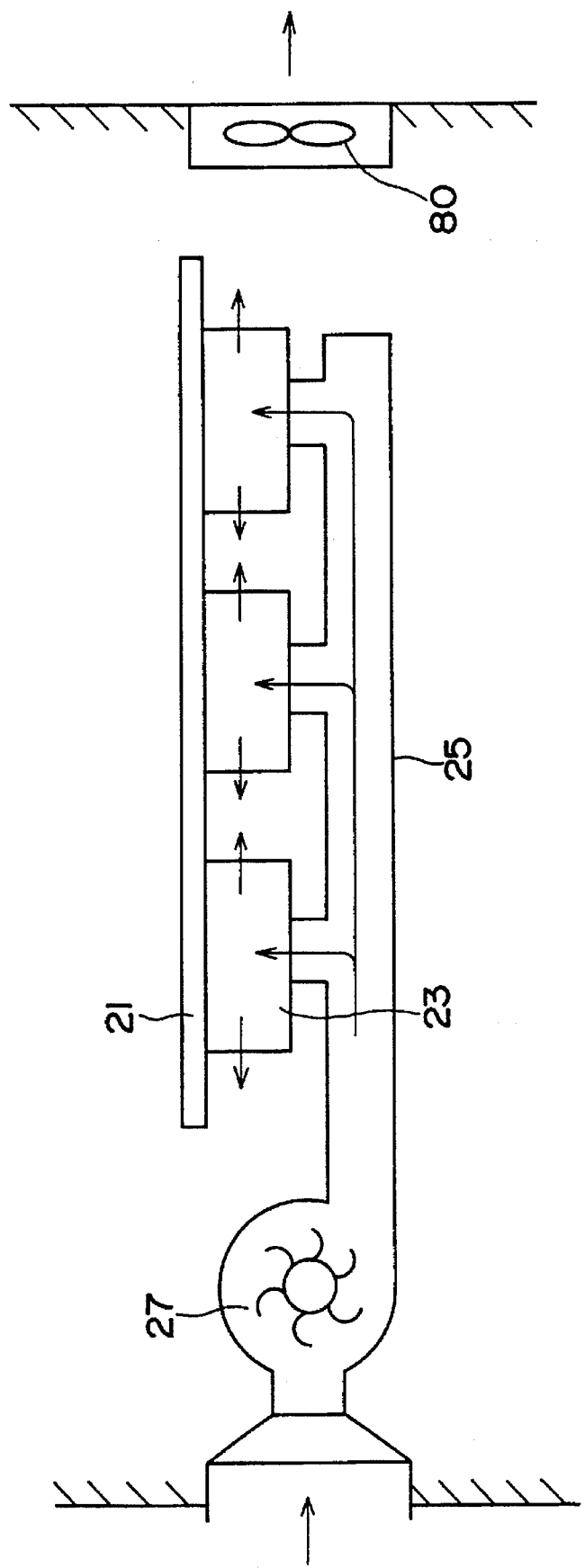
FIG. 16 is a diagram of a seventh embodiment of the present invention.

A description will now be given, with reference to FIG. 16, of a seventh embodiment of the present invention, which differs from the first embodiment thereof in that the seventh embodiment is equipped with an auxiliary coolant transporting device. In FIG. 16, parts that are the same as those shown in the previously described figures are given the same reference numbers.

An auxiliary fun 80, which functions as an auxiliary coolant transporting device, is placed in a position other than the path in which air is supplied from the fan 27 to the modules 22. The auxiliary fan 80 functions to exhaust air in the device to the outside thereof. That is, air warmed or heated by the modules 22 is caused to be exhausted to the outside of the device by means of the auxiliary fan 80.

According to the structure shown in FIG. 16, the velocity of flow of the air from the fan 27 to the modules 22 is increased due to the function of the auxiliary fan 80. Hence, an increased flow rate of air can be supplied to the main duct 25 from the fan 27, and the cooling ability of the cooling system can be increased.

Figure 17:
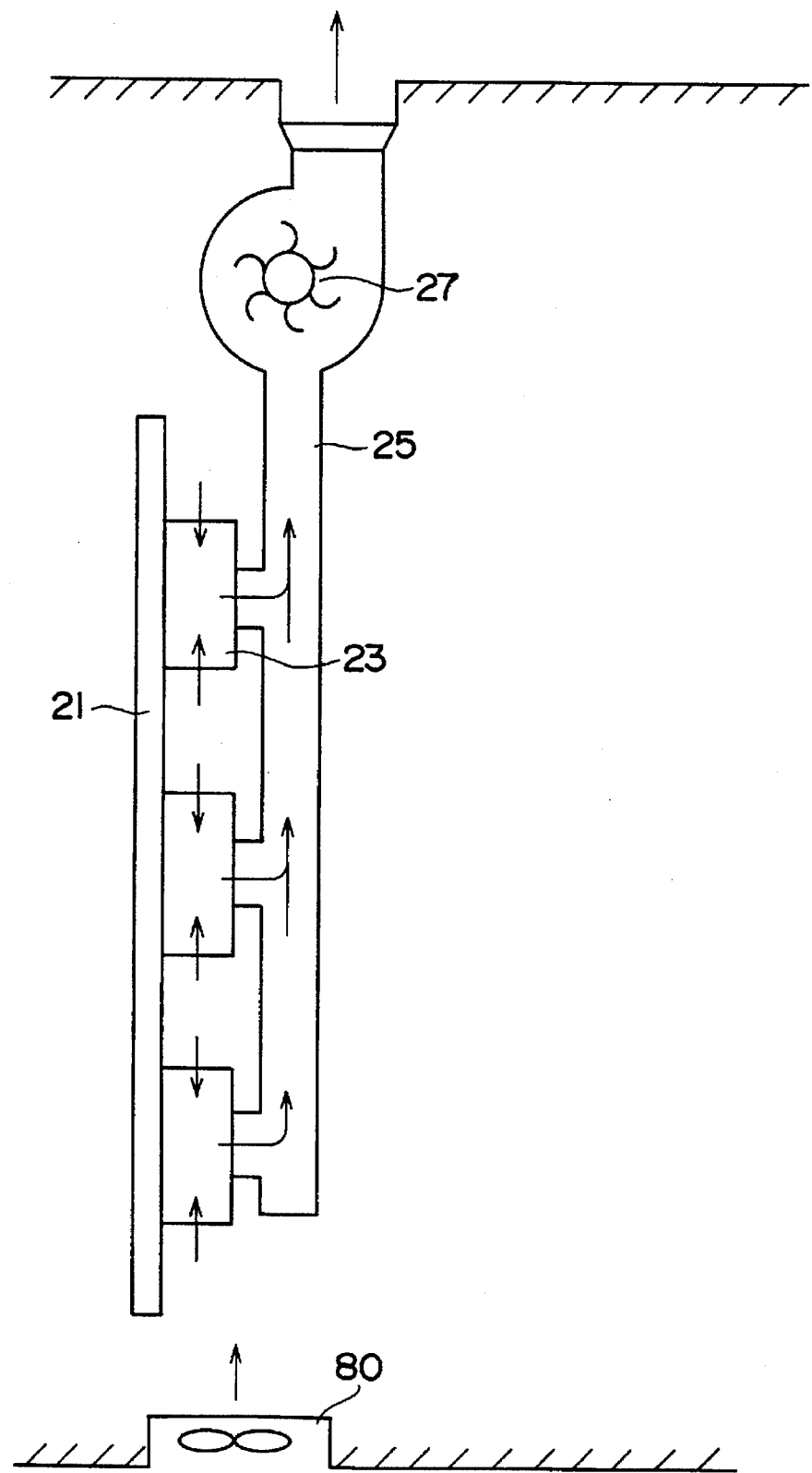
FIG. 17 is a diagram of an alternative auxiliary fan.

It is also possible to use the auxiliary fan 80 as a suction blower and use the fan 27 as an exhaust fan, as shown in FIG. 17. In this structure, air is supplied to the modules 22 and flows upwards, while air flows transversally in the case shown in FIG. 16. Of course, it is possible to arrange the cooling structure shown in FIG. 16 so that air from the fan 27 flows upwards.

Figure 18A:
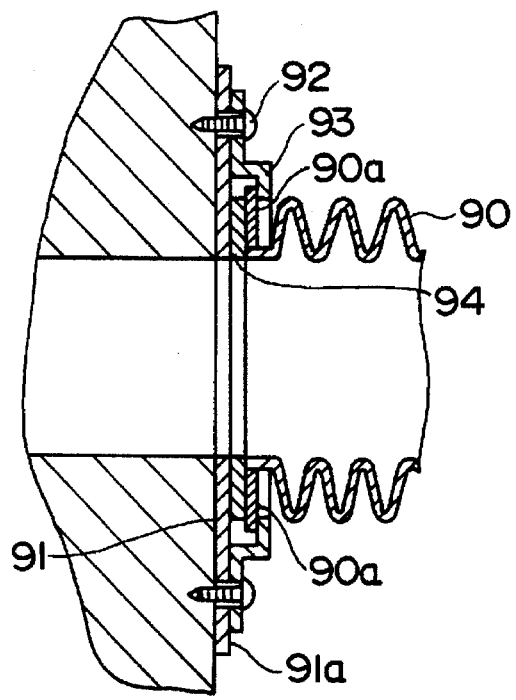
FIG. 18A is a diagram of an eight embodiment of the present invention.

A description will now be given, with reference to FIGS. 18A and 18B, of an eight embodiment of the present invention. In FIG. 18A, a reference number 90 indicates each of the ducts used in the first through seventh embodiments of the present invention, and a reference number 91 indicates a member to which the duct is coupled, such as a fan or an integrated circuit element module.

The duct 90 has a flange 90a is fastened to a flange 91a of the duct-connected member 91 by means of screws 92. An elastic seal member 94 serving as a packing member is interposed between the flange 90a of the duct 90 and the flange 91a of the duct-connected member 91 in order to prevent leakage of the coolant such as air.

Figure 18B:
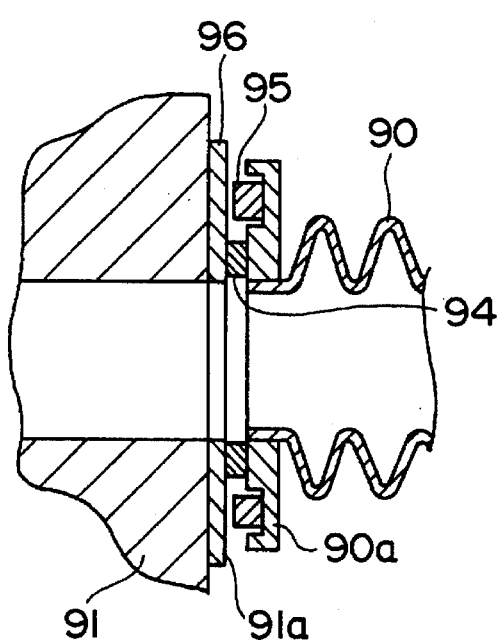
FIG. 18B is a diagram of a variation of the eight embodiment of the present invention.

Instead of the screws 92, a magnet piece 95 and a magnetic member 96 are used as a magnetically fastening mechanism, as shown in FIG. 18B. The magnet piece 95 is attached to the flange 90a, and the magnetic member 96 is attached to the duct-connected member 91. Suction force exerted between the magnet piece 95 and the magnetic member 96 makes the duct 90 and the member 91 joined together. It is easy to definitely attach the duct 90 to the member 91 or detach it therefrom.

If the member 90 itself has a portion made of a magnetic material, the magnetic member 96 can be omitted. It is also possible to attach a magnetic piece to the member 91 and attach a magnetic member to the duct 90. In this case, the duct 90 may have a magnetic portion made of a magnetic material in order to avoid use of the magnetic member.

Figure 19:
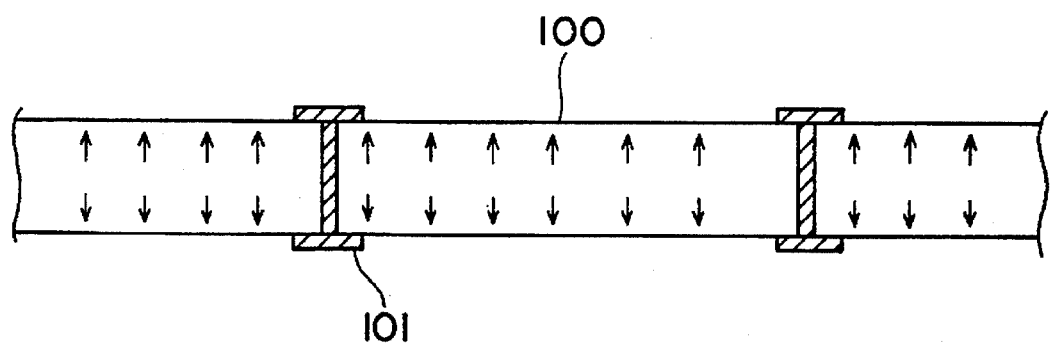
FIG. 19 is a diagram of a ninth embodiment of the present invention.

A description will now be given of a ninth embodiment of the present invention by referring to FIG. 19. In FIG. 19, a reference number 100 indicates the main duct used in the first through seventh embodiments of the present invention. The main duct 100 can be formed by processing a thin plate made of a metallic material or resin. Rib members 101 are intermittently provided, as reinforcement members, to the main duct 100. The rib members 100 function to prevent a deformation of the main duct 100 which may be caused by an increase in the pressure in the main duct 100.

Figure 20A:
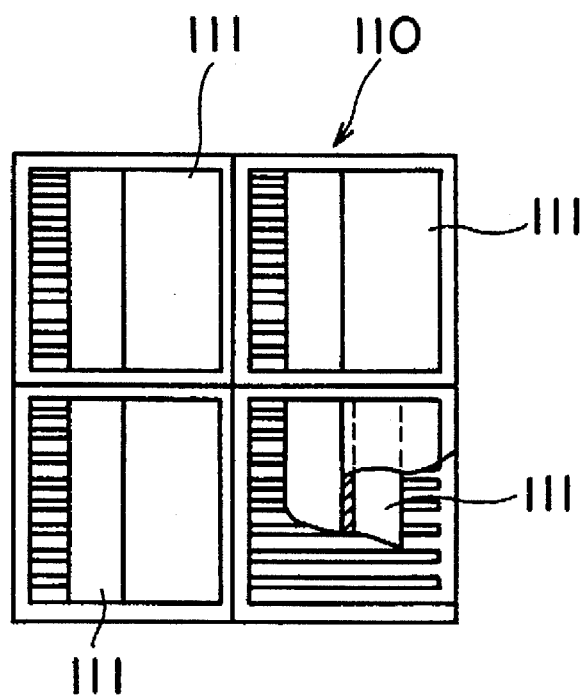
FIG. 20A is a partially sectional, plan view of a heat sink according to a tenth embodiment of the present invention.
Figure 20B:
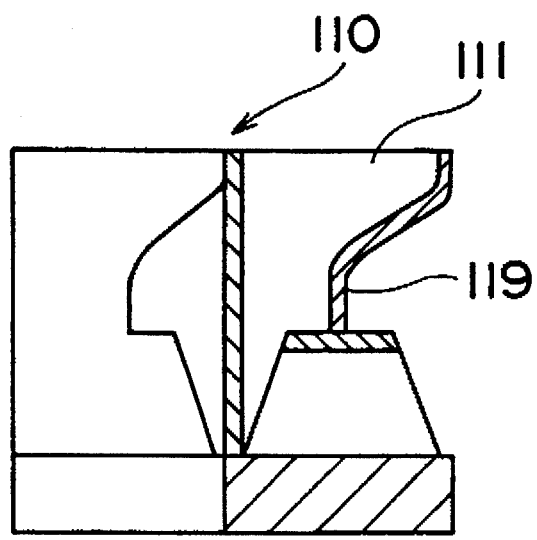
FIG. 20B is a partially sectional, front view of the heat sink shown in FIG. 20A.
Figure 21:
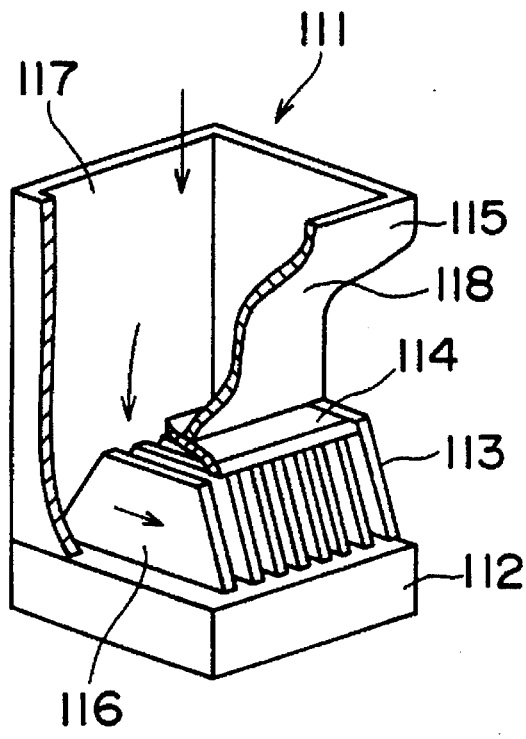
FIG. 21 is a perspective view of a heat sink block used in the heat sink shown in FIGS. 20A and 20B.

A description will now be given, with reference to FIGS. 20A, 20B and 21, of a tenth embodiment of the present invention. FIG. 20A is a cross-sectional view of an upper portion of a heat sink of the tenth embodiment of the present invention, and FIG. 20B is a partially sectional, perspective view of the heat sink. FIG. 21 is a perspective view of a heat sink block provided in the heat sink shown in FIGS. 20A and 20B.

A heat sink 110 shown in these figures is made up of four identical heat sink blocks 111 joined together. Each of the heat sink blocks 111 includes a base 112, a plurality of plate-shaped fins 113, a cover 114 and a partition duct 115. The plate-shaped fins 113 are arranged in parallel on the base 112 and are spaced apart from each other. The fins 113 is made of a material of a good heat conductivity, such as copper or aluminum. The cover 114 is provided over the fins 113, and forms a coolant passage 116 in cooperation with the fins 113 and the base 112. The partition duct 115 has an opening end portion 117 which is located above the cover 114 and has an outer shape simpler to that of the base 112. Further, the opening end portion 117 of the partition duct 115 is joined to the main duct 15 (or 45, 50, 60 or 100), which is not shown in FIGS. 20A, 20B and 21.

The partition duct 115 has another opening end portion located at the other end thereof. The other opening end portion of the partition duct 115 is located at the lower portion of the duct and is connected to the coolant passage 116. The lower opening end portion of the partition duct 115 is defined by the lowermost end thereof and a cover 114 located on the upper portions of the fins 113. One side of the uppermost end of the partition duct 115 is connected to the cover 114 by means of an inwardly inclined or curved wall 118, so that the size of the opening of the partition duct 115 gradually reduces towards the fins 113. The lower opening end portion of the partition duct 115 is a width less than that of the base 112. Air flows in the partition duct 115 and the coolant passage 116, as indicated by the arrows shown in FIG. 21.

The four heat sink blocks 111 are arranged so that outer coolant passages 119 defined by the walls 118 of the ducts 115 of the two blocks 111 located on the right-hand side shown in FIG. 20A continue, and similarly the outer coolant passages 119 defined by the walls 118 of the ducts 115 of the two blocks 111 located on the left-hand side shown in FIG. 20B continue. That is, the walls 118 of the four heat sink blocks 111 face rightwards in FIG. 20A. However, as will be described later, the arrangement of the heat sink blocks is not limited to that shown in FIG. 20A, but can be made so that the outer coolant passages 119 are coupled with each other. The bases 112 of the four heat sink blocks 111 are directly or indirectly mounted on or above one or more integrated circuit elements 23 (not shown in FIGS. 20A, 20B and 21) so that the bases 112 are thermally coupled with the elements 23.

Use of the heat sink blocks 111 makes it possible to flexibly handle various integrated circuit elements 23 and various arrangements thereof mounted on the circuit board. Hence, it is possible to reduce the number of heat sinks of different types to be prepared taking into account the different types of semiconductor integrated elements and to reduce the cost of the cooling system.

The length of each of the inner coolant passages 116 is less than the length of the whole heat sink 110. Hence, it is possible to finely arrange, for the same pressure loss, the fins 113, as compared to the aforementioned fins. The thermal transfer ration of the fins 113 indicating the ability of transferring heat from the surfaces of the fins 113 to the coolant is improved approximately in inverse proportion to the intervals of the adjacent fins. Hence, the heat sink 110 achieves both an improvement in the cooling performance and down-sizing of fins.

Further, a reduction in the length of the coolant passages 116 reduces the temperature differences among the elements 23 due to the temperature differences among the coolants in the passages 116. Hence, it is possible to reduce the flow rate of coolant.

The heat sink blocks 111 are all connected in parallel to the main duct 25 (or 45, 50, 60 or 100). Since the heat sink blocks 111 have the same heat resistance, the coolant is approximately equally distributed to the heat sink blocks 111. Hence, it is possible to obtain an appropriate coolant distribution only by connecting the heat sink blocks 111 to the main duct 25 (or 45, 50, 60 or 100).

Figure 22:
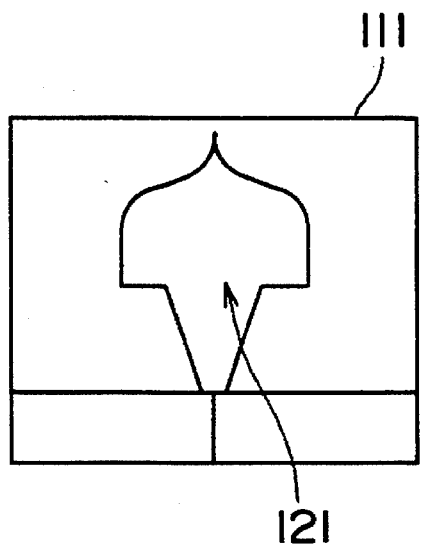
FIG. 22 is a diagram of a heat sink according to a tenth embodiment of the present invention.

The outer coolant passages 119 are formed along the side surfaces of the heat sink blocks 111, and a high degree of freedom in formation and connection of the outer coolant passages between the heat sink blocks. For example, as shown in FIG. 22, the outer coolant passages 119 face each other so that a resultant coolant passage 121 having a width twice that of the passage 119 is formed between the two heat sink blocks 111. It will be noted that, in the arrangement shown in FIG. 20A, the outer coolant passages face in the same direction (the rightwards direction as shown in FIG. 20A). The pressure loss caused in the coolant passage 121 can be drastically reduced. When the bottoms of the bases 112 are squares, it is possible to employ arbitrary arrangements of the heat sink blocks 111.

Figure 23:
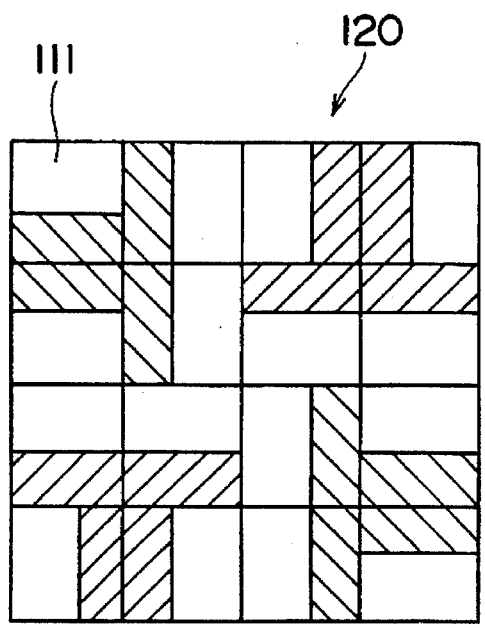
FIG. 23 is a diagram of an arrangement of heat sink blocks shown in FIG. 20.

FIG. 23 is a plan view of a heat sink 120 having a 4×4 block arrangement having 16 heat sink blocks 111. The hatched areas denote the coolant passages 119. The outer coolant passage of each of the four inner heat sink blocks 111 is connected to three outer coolant passages of the three adjacent heat sink blocks 111. Hence, it is possible to suppress the pressure loss caused in the four inner heat sink blocks 111 and to thus reduce the differences between the flow rates of the heat sink blocks 111 and realize uniform cooling.

Figure 24:
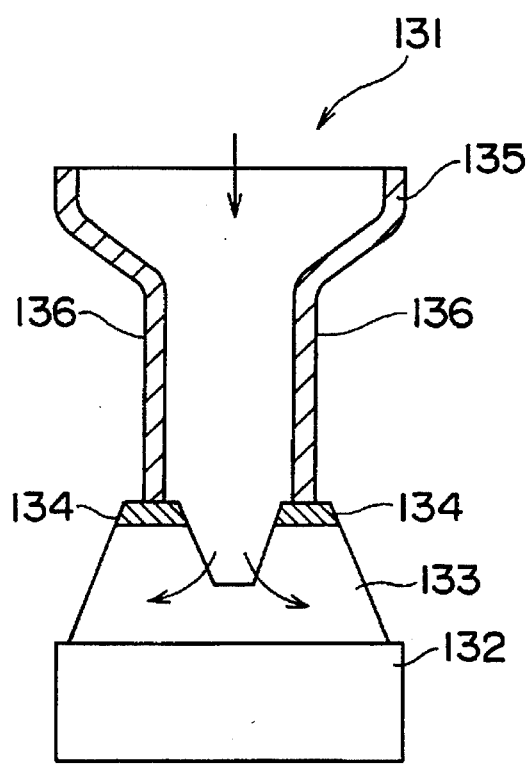
FIG. 24 is a diagram of another heat sink block.

FIG. 24 is cross-sectional view of an alternative heat sink block 131, which has a base 132, fins 133, covers 134 and a duct 135. Two outer coolant passages 136 are formed at the opposite sides of the duct 135. The covers 134 are located on the fins 133, and the lowermost end of the duct 135 is placed on the covers 134. The size of the lower opening of the duct 135 is less than that of the upper opening thereof to which the main duct (not shown) is coupled. There are two inner coolant passages, as indicated by arrows shown in FIG. 24. Each of the two inner coolant passages is shorter than the coolant passage 116 shown in FIG. 21.

Figure 25:
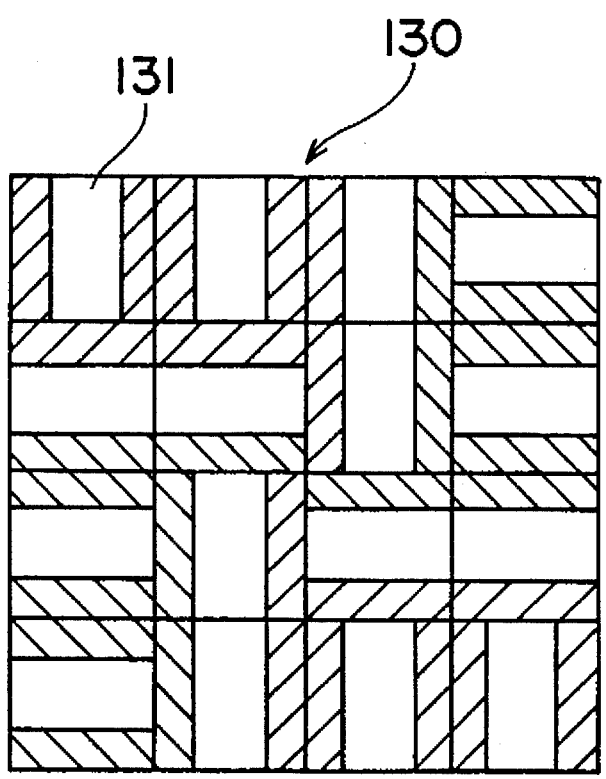
FIG. 25 is a diagram of an arrangement of heat sink blocks shown in FIG. 24.

FIG. 25 shows a heat sink 130 having a 4×4 block arrangement consisting of 16 heat sink blocks 131 shown in FIG. 24. The hatched areas denote the outer coolant passages 136 of the heat sink blocks 131.

As has been described previously, the plate-shaped fins are used in the aforementioned embodiments of the present invention. Alternatively, it is possible to employ other types of fins, such as pin-shaped fins or a porous member through which the coolant passes.

The advantages of the present invention are summarized below.

The cooling structure further includes module joint ducts connecting the main duct to the heat sinks of the circuit element modules. With this structure, it is possible to definitely supply the coolant to the modules via the module joint ducts.

Each of the module joint ducts has a first end which is detachably connected to one of the main duct and a corresponding one of the heat sinks, and a second end which is permanently attached to the other one. Hence, it is easy to perform maintenance and replacement work on the main ducts and the modules.

The cooling structure further includes a mechanism which causes the main duct to pivot about a predetermined shaft, so that the module joint ducts are in contact with the main duct when the mechanism causes the main duct to be located in a predetermined position. Hence, it is easy to perform the maintenance and replacement work on the main ducts and the modules.

The cooling structure further includes a mechanism which causes the main duct to pivot about a predetermined shaft, so that the module joint ducts are in contact with the main duct when the mechanism causes the main duct to be located in a predetermined position. Hence, it is easy to perform the maintenance and replacement work on the main ducts and the modules.

The module joint ducts include members which are expandable and contractible between the main duct and the circuit element modules. Hence, it is possible to easily perform the attachment and detachment operation on the coolant supplying device.

Each of the module joint ducts has a first end which is detachably connected to one of the main duct and a corresponding one of the heat sinks, and a second end which is permanently attached to the other one. Hence, it is possible to easily perform the maintenance and replacement work on the ducts.

The cooling structure further includes a lock mechanism that fastens first ends of the module joint ducts to either the main duct or the heat sinks. Hence, it is possible to perform reliable fastening.

The cooling structure further includes a connection duct which is fastened to the main duct and coupled with the coolant supplying device. Hence, it is possible to easily joint the main duct and the coolant supplying device.

The connection duct has an expandable and contractible structure. Hence, the joining work can be facilitated.

The cooling structure further includes a connection duct which is fastened to the main duct; and a header duct connecting the connection duct and the coolant supplying device together. Hence, the joining work can be facilitated. Further, it is possible to easily increase or decrease the number of substrate modules and/or fans.

The connection duct has an expandable and contractible structure. In this case, the joining work can be further facilitated.

The header duct has first openings and second openings. The connection duct is connected to the header duct so that the connection duct continues to a corresponding one of the first openings. The coolant supply device comprises fans connected to the header duct so that the fans continue to the second openings. Hence, a large amount of pressure loss does not occur while the coolant flows.

The cooling structure further includes a seal plate attached to one of the first openings to which no main duct is connected. Hence, it is possible to prevent leakage of the coolant.

The cooling structure further includes an auxiliary fan which cooperates with the coolant supplying device so that a flow of the coolant is facilitated by said auxiliary fan.

The main duct includes through openings which allow a person to access the module joint ducts. Hence, the maintenance and replacement work on the module joint ducts can be facilitated.

The cooling structure further includes attachment brackets which are attached on the circuit board and support the main duct. Hence, it is possible to obtain a great mechanical strength of the cooling structure.

The cooling structure further includes seal members sealing connections with the module joint ducts. Hence, reliable sealing can be obtained. The cooling structure further includes a seal member sealing a connection with the connection duct. Hence, reliable sealing can be achieved. Also, the cooling structure further includes seal members sealing a connection with the header duct, so that reliable sealing can be obtained.

The cooling structure further includes a magnetically fastening mechanism forming magnetic connections with the module joint ducts, the connection duct, and/or the header duct. Hence, it is possible to realize easy connections between the above parts.

The main duct includes rib members that mechanically reinforce the main duct.

Each of the heat sinks comprises one or more heat sink blocks. Each of the heat sink blocks includes: a base; fins mounted on the base; and a partition duct covering the fins and having a first opening coupled to the main duct and a second opening facing the fins, the first and second openings being coupled together, an inner coolant passage passing through the fins being coupled to the second opening and an outer coolant passage defined by the partition duct. Hence, it is possible to efficiently and effectively cool the modules.

What is claimed is:

1. A cooling structure for cooling circuit element modules, which have heat sinks, that are mounted on a circuit board, said cooling structure comprising:
   a main duct to which the circuit element modules are connected;
   a coolant supplying device which is connected to the main duct and supplies a coolant to the main duct; and
   module joint ducts directly connecting the main duct to the heat sinks of the circuit element modules, each of said module joint ducts having a first end being directly connected to a respective one of said heat sinks and a second end being directly attached to said main duct so as to directly join each of said respective one of said heat sinks to said main duct.

2. The cooling structure as claimed in claim 1, wherein each of the module joint ducts has a first end which is connected to the main duct, and a second end which is connected to a corresponding one of the heat sinks.

3. The cooling structure as claimed in claim 2, further comprising a mechanism which causes the main duct to pivot about a predetermined shaft, so that the module joint ducts are in contact with the main duct when the mechanism causes the main duct to be located in a predetermined position.

4. The cooling structure as claimed in claim 2, further comprising a lock mechanism that fastens first ends of the module joint ducts to either the main duct or the heat sinks.

5. The cooling structure as claimed in claim 1, further comprising a mechanism which causes the main duct to pivot about a predetermined shaft, so that the module joint ducts are in contact with the main duct when the mechanism causes the main duct to be located in a predetermined position.

6. The cooling structure as claimed in claim 1, wherein the main duct comprises openings to which the module joint ducts are connected.

7. The cooling structure as claimed in claim 1, wherein the module joint ducts comprise members which are expandable and contractible between the main duct and the circuit element modules.

8. The cooling structure as claimed in claim 7, wherein each of the module joint ducts has a first end which is connected to the main duct, and a second end which is connected to a corresponding one of the heat sinks.

9. The cooling structure as claimed in claim 1, further comprising a connection duct which is fastened to the main duct and coupled with the coolant supplying device.

10. The cooling structure as claimed in claim 9, wherein said connection duct has an expandable and contractible structure.

11. The cooling structure as claimed in claim 1, further comprising:
   a connection duct which is fastened to the main duct; and
   a header duct connecting the connection duct and the coolant supplying device together.

12. The cooling structure as claimed in claim 11, wherein said connection duct has an expandable and contractible structure.

13. The cooling structure as claimed in claim 11, wherein:
   said header duct has first openings and second openings;
   the connection duct is connected to the header duct so that the connection duct continues to a corresponding one of the first openings; and
   the coolant supply device comprises fans connected to the header duct so that the fans continue to the second openings.

14. The cooling structure as claimed in claim 13, further comprising a seal plate attached to one of the first openings to which no main duct is connected.

15. The cooling structure as claimed in claim 11, further comprising a seal member sealing a connection with the connection duct.

16. The cooling structure as claimed in claim 11, further comprising seal members sealing a connection with the header duct.

17. The cooling structure as claimed in claim 11, further comprising a magnetically fastening mechanism forming a magnetic connection with the connection duct.

18. The cooling structure as claimed in claim 11, further comprising a magnetically fastening mechanism forming a magnetic connection with the header duct.

19. The cooling structure as claimed in claim 1, further comprising an auxiliary fan which cooperates with the coolant supplying device so that a flow of the coolant is facilitated by said auxiliary fan.

20. The cooling structure as claimed in claim 1, wherein the main duct comprises through openings which allow a person to access the module joint ducts.

21. The cooling structure as claimed in claim 1, further comprising attachment brackets which are attached on the circuit board and support the main duct.

22. The cooling structure as claimed in claim 1, further comprising seal members sealing connections with the module joint ducts.

23. The cooling structure as claimed in claim 1, further comprising a magnetically fastening mechanism forming magnetic connections with the module joint ducts.

24. The cooling structure as claimed in claim 1, wherein the main duct comprises rib members that mechanically reinforce the main duct.

25. The cooling structure as claimed in claim 1, wherein:
   each of said heat sinks comprises one or more heat sink blocks; and
   each of the heat sink blocks comprises:
      a base;
      fins mounted on the base; and
      a partition duct covering the fins and having a first opening coupled to the main duct and a second opening facing the fins, the first and second openings being coupled together, an inner coolant passage passing through the fins being coupled to the second opening and an outer coolant passage defined by the partition duct.

26. The cooling structure as claimed in claim 1, wherein the circuit element modules comprise integrated circuit elements.

27. An electronic device, comprising:

a circuit board; and circuit element modules mounted on the circuit board, wherein each of the circuit element modules comprises:

a circuit element mounted on the circuit board; and a heat sink attached to the circuit element and coupled to a main duct in which a coolant is transferred, wherein said heat sink comprises at least one heat sink block, wherein each of the heat sink blocks comprises:

a base attached to the circuit element;

fins mounted on the base; and a partition duct covering and directly connected to the fins and having a first end with a first opening coupled to the main duct and a second end with a second opening facing the fins, the first and second openings being coupled together, an inner coolant passage passing through the fins being coupled to the second opening and an outer coolant passage defined by the partition duct.

28. The electronic device as claimed in claim 27, wherein the heat sink blocks of the heat sink are arranged so that outer coolant passages of adjacent heat sink blocks are coupled together.

29. The electronic device as claimed in claim 27, wherein the heat sink blocks of the heat sink are arranged so that outer coolant passages thereof are oriented in a predetermined direction.

30. The electronic device as claimed in claim 27, wherein the heat sink blocks of the heat sink are arranged so that outer coolant passages of adjacent heat sink blocks face each other.

31. The electronic device as claimed in claim 27, wherein each of the heat sink blocks comprises another outer coolant passage defined by the partition duct.

32. A heat sink block, comprising:

a base to be attached to the circuit element;

fins mounted on the base; and a partition duct covering and directly connected to the fins and having a first end with a first opening to be coupled to a main duct and a second end with a second opening facing the fins, the first and second openings being coupled together, an inner coolant passage passing through the fins being coupled to the second opening and an outer coolant passage defined by the partition duct.

33. The electronic device as claimed in claim 32, wherein the heat sink block comprises another outer coolant passage defined by the partition duct.

* * * * *